US008647073B2

(12) United States Patent
Hoebel et al.

(10) Patent No.: US 8,647,073 B2
(45) Date of Patent: Feb. 11, 2014

(54) ABRASIVE SINGLE-CRYSTAL TURBINE BLADE

(75) Inventors: Matthias Hoebel, Windisch (CH); Alexander Schnell, Baden (CH); Yves Pellaton, Niederrohrdorf (CH)

(73) Assignee: Alstom Technology Ltd., Baden (CH)

( * ) Notice: Subject to any disclaimer, the term of this patent is extended or adjusted under 35 U.S.C. 154(b) by 742 days.

(21) Appl. No.: 12/917,071

(22) Filed: Nov. 1, 2010

(65) Prior Publication Data
US 2011/0103967 A1  May 5, 2011

(30) Foreign Application Priority Data
Nov. 2, 2009 (DE) .......................... 10 2009 051 664

(51) Int. Cl.
*F01D 11/12* (2006.01)
(52) U.S. Cl.
USPC .................................. 416/241 R; 415/173.4
(58) Field of Classification Search
USPC ............ 416/241 R; 415/173.4; 428/687, 679, 428/680
See application file for complete search history.

(56) References Cited

U.S. PATENT DOCUMENTS

| 5,573,862 | A * | 11/1996 | Gualtieri et al. ............... 428/688 |
| 6,194,086 | B1 | 2/2001 | Nenov et al. |
| 6,277,500 | B1 * | 8/2001 | Konter et al. ................. 428/615 |
| 7,094,475 | B2 * | 8/2006 | Schnell et al. ................. 428/678 |
| 7,425,115 | B2 * | 9/2008 | Johnson et al. ............ 415/173.4 |
| 7,586,061 | B2 | 9/2009 | Hoebel et al. |
| 2004/0156724 | A1 | 8/2004 | Torigoe et al. |
| 2010/0322780 | A1 | 12/2010 | Manier |

FOREIGN PATENT DOCUMENTS

| CN | 1776025 A | 5/2006 |
| DE | 102004059904 A1 | 6/2006 |
| EP | 1275743 A2 | 1/2003 |
| EP | 1295969 A1 | 3/2003 |
| EP | 1295970 A1 | 3/2003 |
| EP | 1391537 A1 | 2/2004 |
| EP | 1424158 A1 | 6/2004 |
| EP | 1476272 B1 | 11/2004 |
| WO | 2009083000 A1 | 7/2009 |

* cited by examiner

*Primary Examiner* — Ninh H Nguyen
(74) *Attorney, Agent, or Firm* — Buchanan Ingersoll & Rooney PC

(57) ABSTRACT

A turbine blade for a turbine rotor, is provided having a single-crystal basic body which has a blade tip and extends in the radial direction. The turbine blade includes at least one oxidation-resistant intermediate coating, which is applied by laser metal forming and is epitaxially bonded to the basic body, is arranged on the radially outer blade tip, and in that an at least single-layer, wear-resistant and oxidation-resistant coating, which is applied by laser metal forming and consists of oxidation-resistant binder material and abrasive particles embedded therein, is arranged on at least certain regions of said epitaxial intermediate coating.

18 Claims, 4 Drawing Sheets

ABRASIVE SINGLE-CRYSTAL TURBINE BLADE

FIELD OF INVENTION

The invention deals with the field of gas turbine engineering and materials science. It relates to an abrasive single-crystal turbine blade having a high resistance to oxidation and frictional wear and also to a method for producing such an abrasive single-crystal turbine blade.

BACKGROUND

The reduction of leakage losses in turbines has been the subject of intensive development work for several decades. During operation of a gas turbine, relative movement between the rotor and the housing is unavoidable. The resultant wear of the housing or wear of the blades has the effect that a sealing action is no longer provided. As a solution to this problem, a combination of thick coatings which can be ground away on the heat shield and abrasive protective coatings on the blade tips is provided.

Methods for applying additional coatings to blade tips or for increasing the resistance to wear by suitable modification of the blade tip have been known even since the 1970s. Various methods have likewise been proposed for simultaneously making such protective coatings resistant to frictional contacts and oxidation caused by the hot gas by a combination of abrasive particles (carbides, nitrides, etc.) with oxidation-resistant materials. Many of the proposed methods are expensive and complex to implement, however, making commercial use more difficult. This applies above all also to the application of these methods for single-crystal turbine blades. Here, additional demands are made on the production process because of the special single-crystal microstructure of the basic material. In particular, the production of the abrasive blade tip should have the smallest possible influence on the basic body of the turbine blade. This includes the avoidance of defects at the interface with the basic body of the blade.

One of the popular strategies therefore lies in dispensing entirely with the protection of the blade tip against wear and providing the heat shield with special porous, ceramic rub-in coatings. Owing to their high porosity, these can also be rubbed in to a certain extent by unprotected blade tips. However, considerable technical risks are associated with this method, since the porous, ceramic rub-in coatings do not ensure the same resistance to erosion as dense coatings. A further risk lies in operational changes to the porous, ceramic rub-in coatings (densification by sintering), which can have a negative effect on the tribological properties. For this reason, a combination with wear-resistant (abrasive) blade tips is expedient when using ceramic protective coatings on heat shields.

Turbine blades with abrasive coatings have been known since the 1960s. In recent decades, a plurality of methods for producing abrasive blade tips have been developed as shown, for example, in U.S. Pat. No. 6,194,086 B1. Although the use of laser metal forming (LMF) to build up abrasive blade tips has been known since the start of the 1990s (see for example DE 10 2004 059 904 A1), this method is still used rarely on an industrial scale.

EP 1295969 A1 and EP 1295970 A1 disclose MCrAlY materials which are used as coatings which protect against oxidation, have a relatively large surface area and have the best possible adaptation to a single-crystal basic material.

The (epitaxial) E-LMF method is also likewise known for the controlled remelting of or metal forming on single-crystal components (EP 1476272 B1).

However, the production of abrasive protective coatings with an epitaxially solidified intermediate coating on a single-crystal basic material is not yet known.

SUMMARY

The disclosure is directed to a turbine blade for a turbine rotor. The blade has a single-crystal basic body including a blade tip and extends in the radial direction. At least one oxidation-resistant intermediate coating, which is applied by laser metal forming and is epitaxially bonded to the basic body, is arranged on a radially outer blade tip. An at least single-layer, wear-resistant and oxidation-resistant coating, which is applied by laser metal forming and includes an oxidation-resistant binder material and abrasive particles embedded therein, is arranged on at least portions of the epitaxial intermediate coating.

In another aspect, the disclosure is directed to a method for producing a turbine blade for a turbine rotor. The blade has a single-crystal basic body including a blade tip and extends in the radial direction. At least one oxidation-resistant intermediate coating, which is applied by laser metal forming and is epitaxially bonded to the basic body, is arranged on a radially outer blade tip. An at least single-layer, wear-resistant and oxidation-resistant coating, which is applied by laser metal forming and includes an oxidation-resistant binder material and abrasive particles embedded therein, is arranged on at least portions of the epitaxial intermediate coating. The method includes applying, epitaxially, at least one oxidation-resistant intermediate coating, by laser metal forming, to the surface of the basic body on the radially outer blade tip. The method also includes applying an at least single-layer, wear-resistant and oxidation-resistant coating, by laser metal forming, to at least portions of the epitaxial intermediate coating.

BRIEF DESCRIPTION OF THE DRAWINGS

The drawings show an exemplary embodiment of the invention. The invention is explained in more detail below on the basis of exemplary embodiments and with reference to FIGS. 1 to 5, in which.

DETAILED DESCRIPTION OF THE PREFERRED EMBODIMENTS

Introduction to the Embodiments

Figure 1:
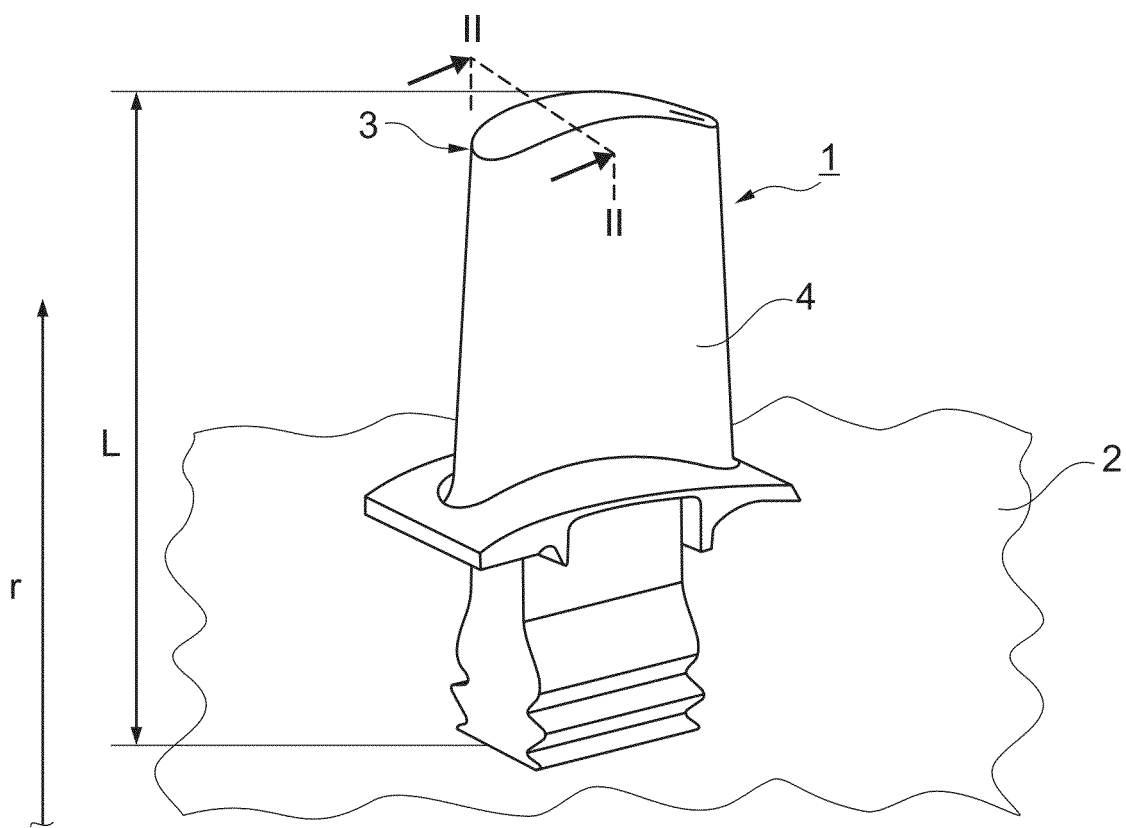
FIG. 1 shows a turbine blade for the rotor of a gas turbine according to a first exemplary embodiment of the invention.

The aim of the invention is to avoid the disadvantages of the known prior art. The invention is based on the object of developing an abrasive single-crystal turbine blade which is distinguished by a high resistance to oxidation and frictional wear, where particular attention is paid to the demands made on the process, which arise owing to the single-crystal nature of the blade material. Similarly, the invention deals with the application for reconditioning or retrofitting single-crystal components.

According to the invention, this object is achieved in that the following features are implemented in a turbine blade for the rotor of a turbine, having a single-crystal basic body which has a blade tip and extends in the radial direction r (in relation to the rotor):

- at least one oxidation-resistant intermediate coating, which is applied by known laser metal forming and is epitaxially bonded to the basic body, is arranged on the radially outer blade tip, and
- an at least single-layer, wear-resistant and oxidation-resistant coating, which is applied by laser metal forming and consists of oxidation-resistant binder material and abrasive particles embedded therein, is arranged on at least certain regions of said epitaxial intermediate coating.

In the method according to the invention for producing such a single-crystal turbine blade, at least one oxidation-resistant intermediate coating is epitaxially applied by laser metal forming to the surface of the basic body on the radially outer blade tip, and an at least single-layer, wear-resistant and oxidation-resistant coating consisting of oxidation-resistant binder material and abrasive particles embedded therein is applied by laser metal forming to at least certain regions of said epitaxial intermediate coating. The temperature or temperature distribution in the melt pool is advantageously recorded online during the build-up of the intermediate coating and of the wear-resistant and oxidation-resistant coating by the laser metal forming method, such that this information can be used, with the aid of a control system, to control the laser power during the laser metal forming method and/or the relative movement between the laser beam and the turbine blade such that the quotient $G^n/V_s$ lies above the material-dependent limit value required for directional, single-crystal solidification, where G denotes the local temperature gradient, $V_s$ denotes the speed of the solidification front and n denotes a further material parameter.

The advantages of the invention are that single-crystal turbine blades are realized with an optimized service life of the abrasive blade tip at high operating temperatures. Together with a suitable grazing coating on the stator side, the leakage losses via the hot gas breach are reduced and the efficiency of the turbine is increased.

It is particularly advantageous that the oxidation-resistant intermediate coating and the radially outer abrasive coating are generated by laser metal forming.

The abrasive blade tip is realized by laser metal forming (LMF). It is preferable to take special demands made on the material and process into account for use on single-crystal turbine blades. In this respect, an oxidation-resistant, single-crystal buffer coating is initially realized at the interface with the blade body, and this coating solidifies epitaxially on the single-crystal basic body of the turbine blade. The actual abrasive coating is then applied to this epitaxially bonded buffer coating. An essential feature of the abrasive coating is the complete embedding of the abrasive particles in an oxidation-resistant matrix. A further feature is the homogeneous distribution of the abrasive particles in the abrasive coating.

The described embodiment of an abrasive single-crystal turbine blade can advantageously be used both for producing new parts and for retrofitting with only minimum adaptation of existing production processes.

Further advantageous refinements are described in the dependent claims.

By way of example, the epitaxial intermediate coating is produced from an oxidation-resistant MCrAlY alloy (in the context of the present disclosure, M stands for Ni, Co or a combination of both elements) of the $\gamma/\beta$ or $\gamma/\gamma'$ type, the chemical composition of which is selected such that upon epitaxial solidification firstly the $\gamma$ phase and only then the $\beta$ or $\gamma'$ phase is formed.

It is advantageous if the chemical composition of said alloy is selected such that it lies in the $\gamma$ phase region and close to the eutectic boundary line between the $\gamma$ and $\beta$ or $\gamma'$ phase regions in the ternary Ni—Al—Cr phase diagram. This also applies to the Ni/Co—Cr—Al phase diagram, since Ni and Co are completely miscible, i.e. Co does not influence the solidification behavior, but only the $\beta$ phase stability temperature or the $\beta$ phase proportion.

Furthermore, it is advantageous if the intermediate coating applied epitaxially to the single-crystal basic body consists of an oxidation-resistant superalloy of the $\gamma/\beta$ or $\gamma/\gamma'$ type having the following chemical composition (amounts in % by weight): 15-30 Cr, 5-10 Al, 0.3-1.2 Y, 0.1-1.2 Si, 0-2 others, remainder Ni, Co, or of an oxidation-resistant superalloy of the $\gamma/\gamma$ type having the following chemical composition (amounts in % by weight): 35-39 Co, 18-24 Cr, 7-9 Al, 0.3-0.8 Y, 0.1-1 Si, 0-2 others, remainder Ni, or of an oxidation-resistant superalloy of the $\gamma/\gamma'$ type having the following chemical composition (amounts in % by weight): 18-26 Cr, 5-8 Al, 0.3-1.2 Y, 0.1-1.2 Si, 0-2 others, remainder Ni, Co. These materials are particularly suitable as intermediate coatings. It is advantageous if the material has a solidification interval between the solidus temperature and liquidus temperature $\Delta T_o$ of less than 50 K and preferably less than 30 K. This reduces the risk of cracking during solidification.

The epitaxial intermediate coating consists of oxidation-resistant material having a chemical composition which is optimized for use with the LMF method. The composition of the material is selected such that, upon solidification from the melt phase, firstly the $\gamma$ phase is formed and solidifies epitaxially on the basic body of the turbine blade.

Furthermore, it is advantageous if the material used for the oxidation-resistant intermediate coating is simultaneously also used as binder material in the wear-resistant and oxidation-resistant coating, because this improves the compatibility of the two coatings further, which has a particularly positive effect on their properties.

Moreover, it has proved to be expedient to use cubic boron nitride (cBN) as the abrasive material in the wear-resistant and oxidation-resistant coating. In the case of multi-layer wear-resistant and oxidation-resistant coatings, it is advantageous if the proportion of abrasive material increases outward in the radial direction r, because then the outermost coating has the highest proportion of abrasive material and thus the highest resistance to wear.

DETAILED DESCRIPTION

Figure 2:
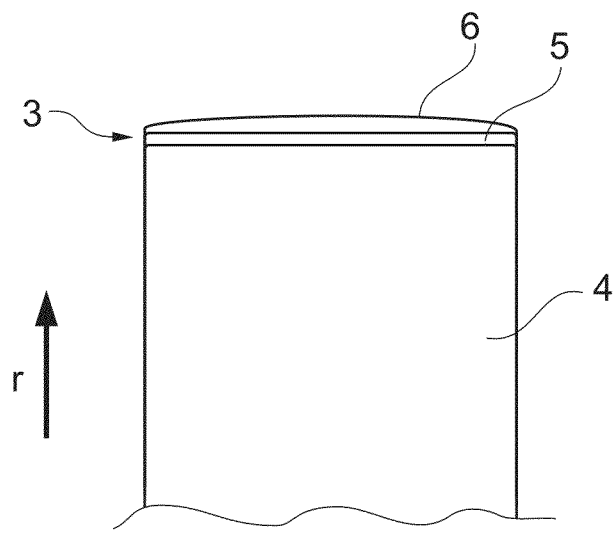
FIG. 2 shows a schematic section along line II-II in FIG. 1.

FIG. 1 is a perspective illustration of a turbine blade 1 for a rotor 2 (shown schematically) of a gas turbine, while FIG. 2 shows a section along line II-II in FIG. 1 in enlarged form. The turbine blade 1 has a single-crystal basic body 4, which extends in the radial direction r (in relation to the rotor) and, according to the invention, has an epitaxial, oxidation-resistant intermediate coating 5, which is applied by LMF and has a wear-resistant and oxidation-resistant coating 6 (see FIG. 2) applied thereto, on the blade tip 3. Here, the coating 6 covers the entire intermediate coating 5, although it is also possible for it to only partially cover the intermediate coating 5. The basic material of the basic blade body is, for example, a single-crystal nickel-based superalloy. In this first exemplary embodiment, the surface of the basic body 4 was uncoated before the LMF method was employed. Both coatings 5 and 6 can have a single-layer or else multi-layer form. The length L of the turbine blade 1 can readily be varied by the number of coatings 5, 6 applied by LMF methods (or by the number of layers applied).

One concept on which the invention is based is that of building up the abrasive coating 6 on the intermediate coating 5 (buffer coating) which is epitaxially solidified on the single-crystal basic blade body 4. The epitaxial intermediate coating 5 is comprised of oxidation-resistant material having a chemical composition which is optimized for use with the LMF method. The composition of the material is selected such that, upon solidification from the melt phase, firstly the γ phase is formed and solidifies epitaxially on the basic body 4 of the turbine blade 1. In order to reduce the risk of cracking during solidification, the composition of the material is optimized such that the solidification interval between the solidus temperature and liquidus temperature is <50 K and preferably <30 K.

In a first variant (as shown in FIGS. 1 and 2), the epitaxial intermediate coating 5 can be applied directly to the blade tip 3 of an uncoated, single-crystal turbine blade 1. In an alternative approach, the epitaxial intermediate coating 5 is applied such that it at least partially overlaps with other, existing protective coatings. In this case, the existing protective coatings may be, for example, so-called MCrAlY coatings 11 (M=Ni, Co or a combination of both elements) which, in the case of most turbine blades subject to high levels of loading, protect the surfaces of the main blade section against oxidation and corrosion (see FIG. 3). In a further, third variant (see FIG. 3), there is also an additional ceramic thermal barrier coating (TBC) 12 on the main blade section, which is not damaged by the subsequent build-up of the abrasive blade tip.

Single-crystal, epitaxial solidification of the oxidation-resistant intermediate coating 5 on the single-crystal basic body 4 of the blade 1 can be achieved by using the material which is specially designed for the LMF process for the binder 7 and the intermediate coating 5, and also by controlled conduction of the process, preferably with online control of the laser power. The risk of cracking during solidification is minimized by the optimized composition of the material used as the intermediate coating 5 and as the binder 7. Efficient protection of those surfaces of the blade tip 3 which are exposed to the hot gas is ensured by the overlapping of the oxidation-resistant intermediate coating 5 with further protective coatings 11, 12 which may be present on the main blade section.

If necessary for achieving the desired blade length L, further layers of oxidation-resistant material can be applied to the first intermediate coating 5. The actual abrasive coating 6 is applied either directly to the epitaxial intermediate coating 5 or to the topmost layer of oxidation-resistant material. For this purpose, abrasive particles are mixed together with oxidation-resistant binder material (preferably made of the material used for the intermediate coating(s)) and applied by the LMF method. Here, the abrasive coating 6 does not have to completely cover the intermediate coating 5, but instead can be formed as an individual strip or as a combination of segments of individual strips. In the case of multi-layer abrasive coatings 6, it is advantageous if the proportion of abrasive material 8 increases outward in the radial direction r, because then the outermost coating 6 has the highest proportion of abrasive material 8 and thus the highest resistance to wear.

The following advantages can also be utilized simultaneously for this coating owing to the optimized selection of the binder material:
  Low susceptibility to cracking
  High resistance to oxidation
  Good wetting and encapsulation of the abrasive particles In terms of production technology, the realization of the abrasive, single-crystal blade tip by the E-LMF method after preceding, conventional coating of the main blade section is particularly interesting: in this process sequence, existing production processes have to be modified only minimally and it is possible to dispense with the masking of the abrasive coating during the application of the MCrAlY protective coatings on the main blade section. The component (turbine blade 1) can therefore be used without carrying out further, subsequent steps immediately after the abrasive blade tip has been applied. It is advantageously possible to dispense with further heat treatment.

Figure 3:
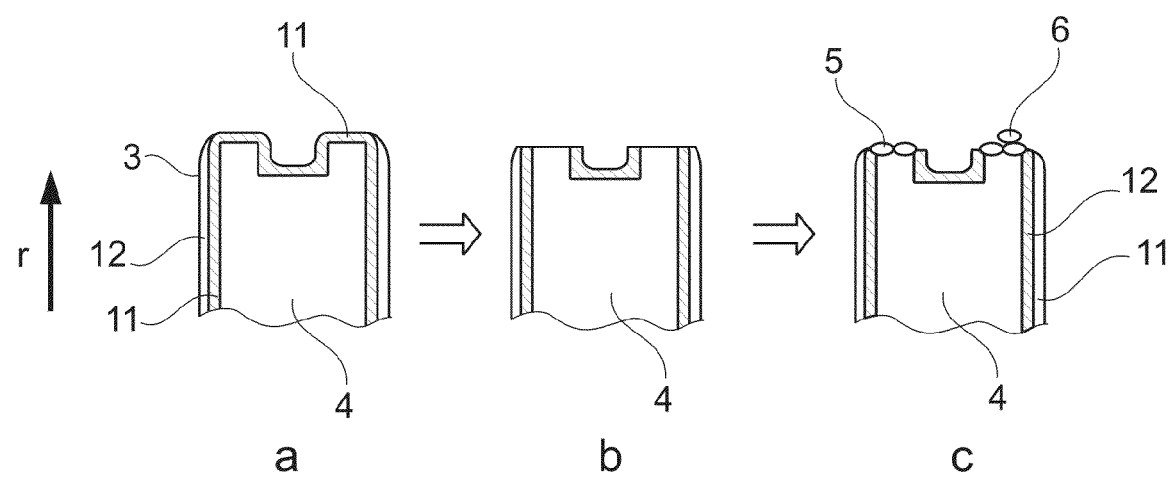
FIGS. 3a, 3b, and 3c show the production sequence for the production of an abrasive single-crystal turbine blade according to a second exemplary embodiment of the invention.

One possible production sequence for the production of an abrasive single-crystal turbine blade 1 according to the invention is shown in FIG. 3. An MCrAlY adhesive coating 11 is applied to the surface of a blade body 4, which consists of a single-crystal material, for example a single-crystal Ni-based superalloy, and a ceramic thermal barrier coating (TBC) 12 is applied in turn to said adhesive coating (see FIG. 3a). The coating on the radially outer blade tip 3, which is in the form of a crown in this exemplary embodiment, is removed mechanically and/or chemically, e.g. ground away, milled away or etched away (see FIG. 3b), such that the surface of the single-crystal basic body 4 at this point is free from protective coatings, i.e. is uncovered. According to the invention, an epitaxially solidified intermediate coating 5 and an abrasive coating 6 thereon are then applied by E-LMF (see FIG. 3c).

Figure 4:
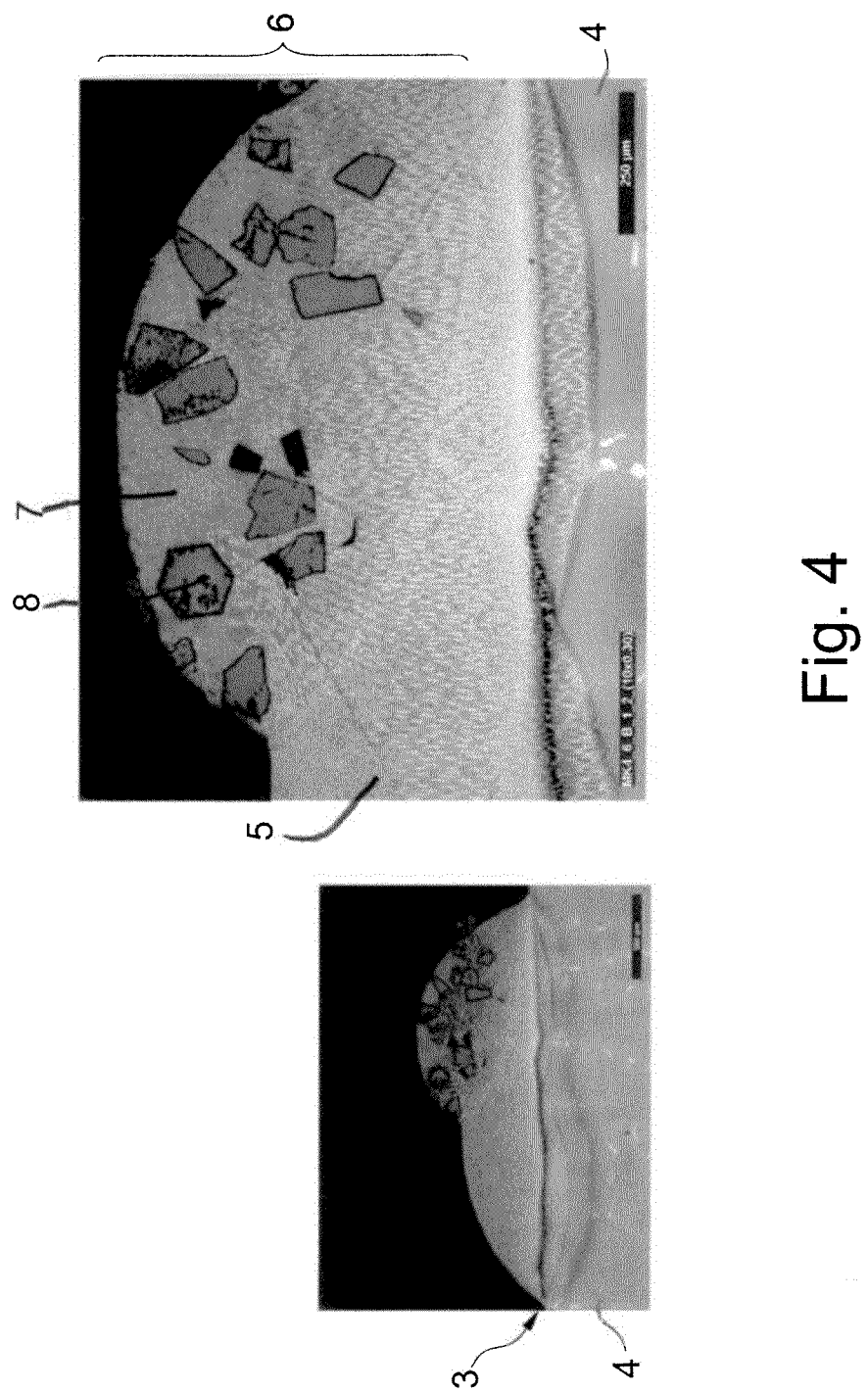
FIG. 4 shows photographic images of a combination of coatings, produced by the LMF method, on a single-crystal turbine blade.

FIG. 4 shows photographic images of an exemplary realization of such an abrasive single-crystal blade tip 3, which was produced by the LMF method. Here, the blade tip 3 is designed as a crown. The radiation source used was a fiber-coupled high-power diode laser having an output power of 1000 W. The intermediate coating 5 (buffer coating), which is solidified epitaxially and in single-crystal form and is comprised of the alloy known commercially under the name Amdry 995, is firstly arranged on the single-crystal basic body 4 (nickel-based superalloy MK4) on the radially outer surface, the optimum microstructure of said coating also continuing at the interface with the overlying abrasive coating 6 which, in this exemplary embodiment, consists of Amdry 995 as binder material 7 and cBN particles embedded therein as abrasive material 8. Naturally, continuation of the single-crystal microstructure is no longer possible above the first abrasive particles 8.

The following alloys are suitable as the material for the epitaxial intermediate coating 5 or as binder material 7:
  oxidation-resistant MCrAlY alloys (M=Ni, Co or combinations of both elements) of the γ/γ or γ/γ' type, the chemical composition of which is selected such that upon epitaxial solidification firstly the γ phase and only then the β or γ' phase is formed;
  oxidation-resistant MCrAlY alloys of the γ/β or γ/γ' type, the chemical composition of which is selected such that it lies in the γ phase region and close to the eutectic boundary line between the γ and β or γ' phase regions in the ternary Ni—Al—Cr phase diagram or Ni/Co—Al phase diagram;
  oxidation-resistant MCrAlY alloys of the γ/β or γ/γ' type having the following chemical composition (amounts in % by weight): 15-30 Cr, 5-10 Al, 0.3-1.2 Y, 0.1-1.2 Si, 0-2 others, remainder Ni, Co;
  oxidation-resistant MCrAlY alloys of the γ/β type having the following chemical composition (amounts in % by weight): 35-39 Co, 18-24 Cr, 7-9 Al, 0.3-0.8 Y, 0.1-1 Si, 0-2 others, remainder Ni;

oxidation-resistant MCrAlY alloys of the γ/γ' type having the following chemical composition (amounts in % by weight): 18-26 Cr, 5-8 Al, 0.3-1.2 Y, 0.1-1.2 Si, 0-2 others, remainder Ni, Co.

These materials are particularly suitable as intermediate coatings 5, but also as binder material 7 in the abrasive coatings 6. It is advantageous if the material has a solidification interval between the solidus temperature and liquidus temperature $\Delta T_0$ of less than 50 K and preferably less than 30 K. This reduces the risk of cracking during solidification.

Figure 5:
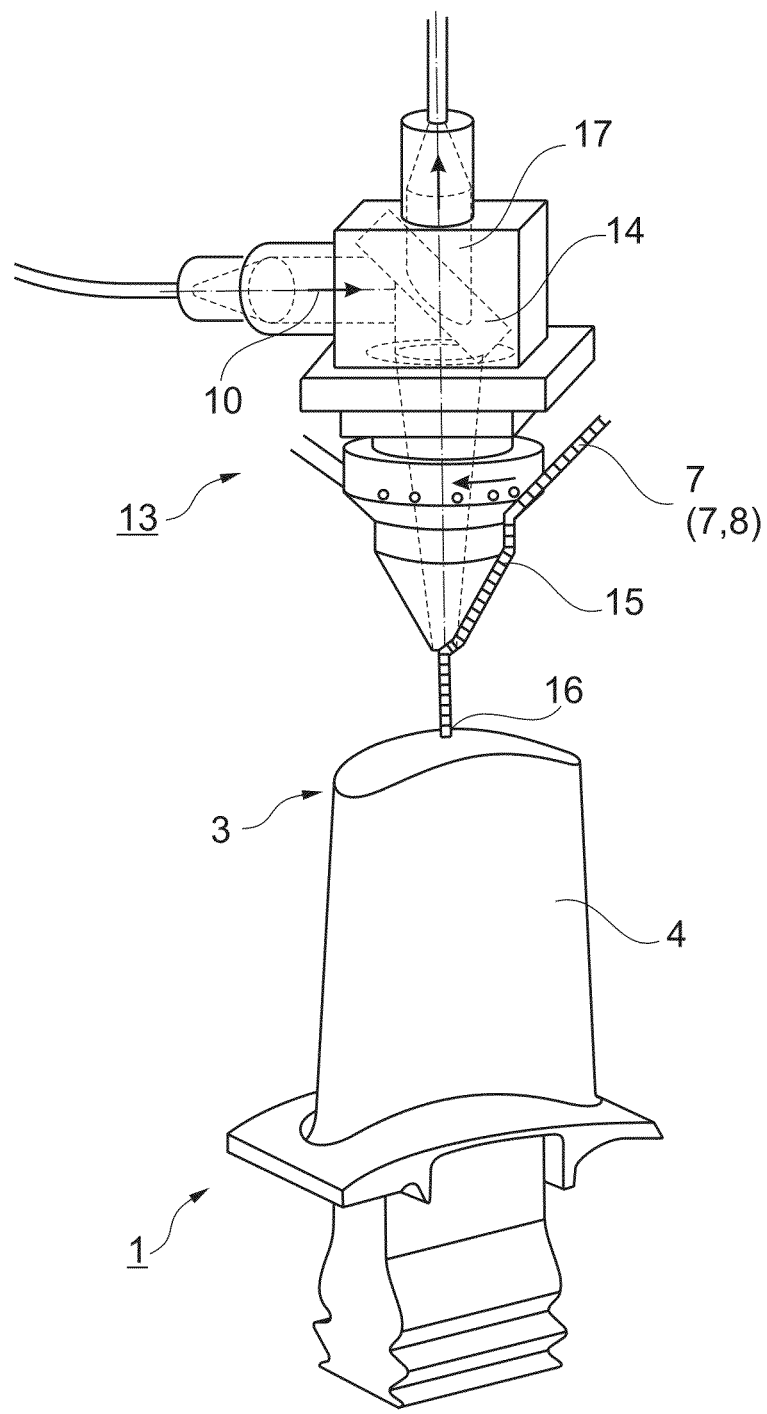
FIG. 5 shows the coating apparatus and the principle of the E-LMF method.

FIG. 5 shows a coating apparatus 13 for carrying out the method according to the invention and the (epitaxial) LMF process with coaxial injection of the powder particles about a focused, high-intensity laser beam 10. The apparatus 13 is described in detail in U.S. Pat. No. 7,586,061 (B2), the contents of which are incorporated by reference as if fully set forth. Movement of the powder nozzle (or of the workpiece, here turbine blade 1), which is effected with the aid of a robot (not shown), permits full 6-axis flexibility of the process. A dichroic mirror 14 deflects the high-intensity laser light 10 onto the component 1 and focuses it at a small aiming point. The mirror 14 is transparent to the process light, which is coupled to an optical pyrometer (not shown) which makes online control of the temperature of the melt pool 16 possible.

When subjecting the blade tip 3 to laser metal forming, the material 7 for the intermediate coating 5 (or abrasive material 8 and oxidation-resistant binder material 7 for the coating 6) is (are) mixed in a powder nozzle, transported by a carrier gas 15 and then injected concentrically about the laser beam 10 as a focused jet of powder into the melt pool 16 produced by the laser beam 10 on the blade tip 3. In addition, the temperature or temperature distribution in the melt pool is recorded online during the laser metal forming (optical temperature signal 17), and this information is used, with the aid of a control system (not shown), to control the laser power during the laser metal forming and/or to change the relative movement between the laser beam 10 and the turbine blade 1 in a controlled manner.

In the example described, the integrated pyrometer makes it possible to determine the temperature of the melt pool during the laser process. By feedback of the temperature signal 17 to the laser controller (not shown), it is possible with the aid of a real-time control process to adapt the laser power automatically, such that the criteria required for epitaxial solidification are satisfied: to this end, the quotient $G^n/V_s$ has to lie above a material-dependent limit value required for directional, single-crystal solidification. Here, G denotes the local temperature gradient, $V_s$ denotes the speed of the solidification front and n denotes a further material parameter.

The present disclosure provides an inexpensive and simple method for producing abrasive protective coatings for single-crystal turbine blades. The useful service life of the abrasive coating at high operating temperatures is increased by the complete embedding of the abrasive particles in an oxidation-resistant binder matrix. The advantages of abrasive coatings can thus be ensured at least for the duration of the running-in operation.

A good resistance to oxidation is firstly ensured by the special material properties of the binder. Secondly, the solidification properties of the material are optimized for use with epitaxial laser metal forming (E-LMF): the advantageous epitaxial bond to the basic material can thus be achieved while at the same time minimizing the risk of defect formation. Since single-crystal components, e.g. single-crystal turbine blades, are exposed to the greatest thermomechanical loading, the retention of the mechanical integrity (no defects or cracks) is a key prerequisite for use in a turbine.

The abrasive coatings of single-crystal turbine blades have a very high commercial potential in powerful turbines of the most recent generation. Here, single-crystal components are used in the first turbine stage (HPT=high-pressure turbine and/or LPT=low-pressure turbine). At present, there is still no satisfactory solution for optimizing hot gas leakage losses for these components. The present invention makes it possible to reduce the leakage between the heat shield and the tips of the turbine blades. Over the useful service life of the abrasive coating, ovalization of the housing or eccentricity between the rotor and the housing as a result of the turbine blades grinding in can be corrected as part of a suitably configured run-in procedure.

Even after the abrasive coating is lost, the basic body of the blade remains protected throughout the nominal service life owing to the good oxidation resistance of the weld filler used as the binder and buffer coating.

The increased resistance to wear of the abrasive turbine blade with respect to frictional contacts makes it possible to apply relatively dense ceramic coatings to the heat shields. Good rub-in behavior during a run-in procedure can thus be combined with the requisite long-term erosion resistance of the ceramic coatings on the heat shields.

An interesting commercial potential is also the retrofitting or reconditioning of existing blades. These can be modified by the method according to the disclosure in order to achieve reduced leakage losses and thus improved efficiency of the turbine when they are refitted. For this option, it is not necessary to, in advance, remove a protective coating which may already be present on the main blade section. This therefore provides an interesting option for the reconditioning of single-crystal gas turbine blades.

The method can be used with all single-crystal turbine blades 1. The limited service life of the abrasive coating 6, which is dependent on the respective operating conditions (temperature, fuel), must be taken into consideration. The service life is optimized by good distribution and complete embedding of the abrasive particles 8 in the oxidation-resistant binder matrix 7. Nevertheless, the main aim is to protect the turbine blade tip 3 above all during the run-in phase (several dozen to several hundred operating hours). In order to make the best possible use out of the special properties of the abrasive protective coating 6, a run-in procedure tailored to the abrasive turbine blades 1 should be used.

It goes without saying that the invention is not restricted to the exemplary embodiments described.

LIST OF REFERENCE SYMBOLS

1 Turbine blade
2 Rotor
3 Blade tip
4 Single-crystal basic body
5 Epitaxial, oxidation-resistant intermediate coating
6 Wear-resistant and oxidation-resistant coating
7 Binder material
8 Abrasive material
10 Laser beam
11 Metallic protective coating (MCrAlY coating)
12 Ceramic thermal barrier coating (TBC)
13 Coating apparatus
14 Dichroic mirror
15 Carrier gas
16 Melt pool
17 Optical temperature signal
r Radial direction
L Length of the turbine blade

What is claimed is:

1. A turbine blade (1) for a turbine rotor (2), the blade (1) having a single-crystal basic body (4) comprising a blade tip (3) and extends in a radial direction (r), at least one oxidation-resistant intermediate coating (5), which is applied by laser metal forming and is epitaxially bonded to the basic body (4), is arranged on a radially outer blade tip (3), and an at least single-layer, wear-resistant and oxidation-resistant coating (6), which is applied by laser metal forming and is comprised of oxidation-resistant binder material (7) and abrasive particles (8) embedded therein, is arranged on at least portions of said epitaxial intermediate coating (5).

2. The turbine blade (1) as claimed in claim 1, wherein the intermediate coating (5) is comprised of an oxidation-resistant $\gamma/\beta$ or $\gamma/\gamma'$ type MCrAlY alloy, the chemical composition of which is selected such that upon epitaxial solidification, the $\gamma$ phase is firstly formed and only then the $\beta$ or $\gamma'$ phase is formed.

3. The turbine blade (1) as claimed in claim 1, wherein the intermediate coating (5) is comprised of an oxidation-resistant MCrAlY alloy having a solidification interval between the solidus temperature and liquidus temperature $\Delta T_0$ of less than 50 K, preferably less than 30 K.

4. The turbine blade (1) as claimed in claim 1, wherein the intermediate coating (5) is comprised of an oxidation-resistant $\gamma/\beta$ or $\gamma/\gamma'$ type MCrAlY alloy, the chemical composition of which is selected such that it lies in the $\gamma$ phase region and proximate an eutectic boundary line between the $\gamma$ and $\beta$ or $\gamma'$ phase regions in a ternary Ni—Al—Cr phase diagram or Ni/Co—Al—Cr phase diagram.

5. The turbine blade (1) as claimed in claim 1, wherein the intermediate coating (5) is comprised of an oxidation-resistant $\gamma/\beta$ or $\gamma/\gamma'$ type MCrAlY alloy having the following chemical composition: 15-30% by weight Cr, 5-10% by weight Al, 0.3-1.2% by weight Y, 0.1-1.2% by weight Si, 0-2% by weight others, remainder Ni, Co.

6. The turbine blade (1) as claimed in claim 5, wherein the intermediate coating (5) is comprised of an oxidation-resistant $\gamma/\beta$ type MCrAlY alloy having the following chemical composition: 35-39% by weight Co, 18-24% by weight Cr, 7-9% by weight Al, 0.3-0.8% by weight Y, 0.1-1% by weight Si, 0-2% by weight others, remainder Ni.

7. The turbine blade (1) as claimed in claim 5, the intermediate coating (5) is comprised of an oxidation-resistant $\gamma/\gamma'$ type MCrAlY alloy having the following chemical composition: 18-26% by weight Cr, 5-8% by weight Al, 0.3-1.2% by weight Y, 0.1-1.2% by weight Si, 0-2% by weight others, remainder Ni, Co.

8. The turbine blade (1) as claimed in claim 1, wherein the material used for the oxidation-resistant intermediate coating (5) is also used as binder material (7) in the wear-resistant and oxidation-resistant coating (6).

9. The turbine blade (1) as claimed in claim 1, wherein the abrasive material (8) in the wear-resistant and oxidation-resistant coating (6) is cubic boron nitride (cBN).

10. The turbine blade (1) as claimed in claim 1, wherein a proportion of abrasive material (8) in the wear-resistant and oxidation-resistant coating (6), if said coating has a multi-layer form, increases outward in the radial direction (r).

11. The turbine blade (1) as claimed in claim 1, wherein said turbine blade is a reconditioned turbine blade.

12. The turbine blade (1) as claimed in claim 11, wherein the turbine blade was initially used in a preceding service interval without an abrasive blade tip (3).

13. The turbine blade (1) as claimed in claim 1, wherein the turbine blade is a new component.

14. The turbine blade (1) as claimed in claim 1, having a length (L), wherein the length (L) is varied as a function of the number of oxidation-resistant, epitaxial intermediate coatings (5) and/or wear-resistant and oxidation-resistant coatings (6) built up by laser metal forming.

15. A method for producing a turbine blade (1) for a turbine rotor (2), the blade (1) having a single-crystal basic body (4) comprising a blade tip (3) and extends in a radial direction (r), at least one oxidation-resistant intermediate coating (5), which is applied by laser metal forming and is epitaxially bonded to the basic body (4), is arranged on a radially outer blade tip (3), and an at least single-layer, wear-resistant and oxidation-resistant coating (6), which is applied by laser metal forming and is comprised of oxidation-resistant binder material (7) and abrasive particles (8) embedded therein, is arranged on at least portions of said epitaxial intermediate coating (5), the method comprising:

applying, epitaxially, at least one oxidation-resistant intermediate coating (5), by laser metal forming, to the surface of the basic body (4) on the radially outer blade tip (3); and applying an at least single-layer, wear-resistant and oxidation-resistant coating (6), by laser metal forming, to at least portions of said epitaxial intermediate coating (5).

16. The method as claimed in claim 15, wherein a temperature or temperature distribution in a melt pool (16) is recorded online during build-up of the intermediate coating (5) and of the wear-resistant and oxidation-resistant coating (6) by the laser metal forming method, which is used, with a control system, to control laser power during the laser metal forming method and/or the relative movement between a laser beam (10) and the turbine blade (1) such that quotient $G^n/V_s$ lies above a material-dependent limit value required for directional, single-crystal solidification, where G denotes a local temperature gradient, $V_s$ denotes a speed of the solidification front and n denotes a further material parameter.

17. The method as claimed in claim 16, wherein during the laser metal forming step for producing the wear-resistant and abrasive coating (6), abrasive particles (8) and oxidation-resistant binder material (7) are mixed in a powder nozzle and then injected concentrically about the laser beam (10) as a focused jet of powder into the melt pool (16).

18. The method as claimed in claim 15, wherein, in a preceding production step, at least portions on the surface of the basic body (4) of the turbine blade (1) are coated with an oxidation-resistant, metallic protective coating (11), in particular an MCrAlY coating, and an oxidation-resistant, ceramic thermal barrier coating (12) is optionally applied to said protective coating (11), wherein the at least one metallic and optional ceramic protective coating (11, 12) on the radially outer blade tip (3) is removed by controlled machining, in particular grinding away, CNC milling and/or chemical coating removal, and the epitaxially solidified, oxidation-resistant intermediate coating (5) which is then built up by the laser metal forming is applied such that it at least partially overlaps only with the MCrAlY coating (11) which extends in the radial direction, but not with the additional optional ceramic thermal barrier coating (12).

* * * * *